US011233021B2

(12) United States Patent
Lu et al.

(10) Patent No.: US 11,233,021 B2
(45) Date of Patent: Jan. 25, 2022

(54) ARRAY SUBSTRATE, DISPLAY PANEL, AND DISPLAY DEVICE HAVING A NOTCHED DISPLAY AREA

(71) Applicant: WUHAN CHINA STAR OPTOELECTRONICS TECHNOLOGY CO., LTD., Hubei (CN)

(72) Inventors: Yantao Lu, Wuhan (CN); Guanghui Liu, Wuhan (CN); Chao Wang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 68 days.

(21) Appl. No.: 16/496,687

(22) PCT Filed: Apr. 29, 2019

(86) PCT No.: PCT/CN2019/084915
§ 371 (c)(1),
(2) Date: Sep. 23, 2019

(87) PCT Pub. No.: WO2020/168634
PCT Pub. Date: Aug. 27, 2020

(65) Prior Publication Data
US 2020/0279820 A1 Sep. 3, 2020

(30) Foreign Application Priority Data
Feb. 22, 2019 (CN) .......................... 2019/10133852.0

(51) Int. Cl.
*H01L 25/18* (2006.01)
*H01L 51/00* (2006.01)
(Continued)

(52) U.S. Cl.
CPC .......... *H01L 24/05* (2013.01); *G01R 31/2825* (2013.01); *G01R 31/2884* (2013.01); *H01L 23/544* (2013.01); *H01L 23/585* (2013.01); *H01L 24/06* (2013.01); *H01L 24/08* (2013.01); *H01L 25/18* (2013.01); *H01L 27/124* (2013.01); *G02F 1/133305* (2013.01);
(Continued)

(58) Field of Classification Search
CPC ......... H01L 24/05; H01L 24/06; H01L 24/08; H01L 25/18; H01L 51/0097; H01L 2251/5338; H01L 27/3276; H01L 27/3244; H01L 27/3297; H01L 27/1464; H01L 23/544; G02F 1/133305
See application file for complete search history.

(56) References Cited

U.S. PATENT DOCUMENTS

10,229,650 B2 * 3/2019 Wu .................... G09G 5/003
10,267,976 B1 * 4/2019 Zheng ................ G02B 6/0081
(Continued)

*Primary Examiner* — Ida M Soward (57) ABSTRACT

An array substrate, a display panel, and a display device. The array substrate includes a substrate. The substrate has a display area and a non-display area adjacent to the display area, and the non-display area of the substrate has a first notch away from an end of the display area. A first edge of the first notch disposed near the display area of the substrate is provided with a binding area. The display device has a narrow border and a high screen ratio.

15 Claims, 7 Drawing Sheets

(51) Int. Cl.
*H01L 27/32* (2006.01)
*H01L 27/14* (2006.01)
*H01L 23/544* (2006.01)
*H01L 23/00* (2006.01)
*H01L 27/12* (2006.01)
*G01R 31/28* (2006.01)
*H01L 23/58* (2006.01)
*H01L 27/146* (2006.01)
*G02F 1/1333* (2006.01)

(52) U.S. Cl.
CPC ...... *H01L 27/1464* (2013.01); *H01L 27/3244* (2013.01); *H01L 27/3276* (2013.01); *H01L 51/0097* (2013.01); *H01L 2224/05639* (2013.01); *H01L 2224/06515* (2013.01); *H01L 2224/08145* (2013.01); *H01L 2251/5338* (2013.01)

(56) References Cited

U.S. PATENT DOCUMENTS

| | | | |
|---|---|---|---|
| 10,503,297 B2* | 12/2019 | Zeng | H04M 1/0266 |
| 10,546,912 B2* | 1/2020 | Zhou | H01L 24/09 |
| 10,608,022 B2* | 3/2020 | Zhou | H01L 27/124 |
| 10,650,723 B2* | 5/2020 | Wu | G09G 3/20 |
| 10,707,290 B2* | 7/2020 | Yu | H01L 27/3276 |
| 10,741,136 B2* | 8/2020 | Ma | G09G 3/20 |
| 10,769,994 B2* | 9/2020 | Ka | G09G 3/3648 |
| 10,783,825 B2* | 9/2020 | Liu | G09G 3/3225 |
| 10,860,057 B2* | 12/2020 | Wu | G06F 1/1605 |
| 10,861,924 B2* | 12/2020 | Li | G02F 1/136286 |
| 2016/0190081 A1* | 6/2016 | Kang | H01L 24/11 257/737 |
| 2019/0121211 A1* | 4/2019 | Luo | H01L 27/3279 |
| 2019/0267434 A1* | 8/2019 | Liu | G06F 1/1637 |
| 2019/0272790 A1* | 9/2019 | Chang | H01L 27/3225 |
| 2020/0135832 A1* | 4/2020 | Ma | G09G 3/3225 |
| 2020/0150487 A1* | 5/2020 | Zhou | G02F 1/13338 |
| 2020/0235194 A1* | 7/2020 | Ito | H05B 33/22 |
| 2021/0028270 A1* | 1/2021 | Yokoyama | H01L 27/3276 |

\* cited by examiner

ARRAY SUBSTRATE, DISPLAY PANEL, AND DISPLAY DEVICE HAVING A NOTCHED DISPLAY AREA

FIELD OF INVENTION

The present disclosure relates to the field of display technologies, and more particularly to an array substrate, a display panel, and a display device.

BACKGROUND OF INVENTION

With the increasing popularity of high screen ratio displays, high screen ratio displays have become a research hotspot.

At present, use of chip on film (COF) technologies on a lower frame of a display to reduce a width of the lower frame is a way to achieve a high screen ratio of the display. However, when the COF is bound to a binding area of the lower frame, an excessive vertical distance of the binding area configured to bind the COF to a display area of a display panel causes the display difficult to achieve a narrow border and a high screen ratio.

Therefore, it is necessary to propose a technical solution to solve issues that a vertical distance of a binding area to a display area of a display panel is too large, and the display panel is difficult to achieve a narrow border and a high screen ratio.

SUMMARY OF INVENTION

An object of the present disclosure is to provide an array substrate, a display panel, and a display device, and the array substrate facilitates the display panel and the display device to achieve a narrow border and a high screen ratio.

An embodiment of the present disclosure provides an array substrate. The array substrate includes a substrate. The substrate includes a display area and a non-display area adjacent to the display area. The non-display area of the substrate away from an end of the display area has a first notch, and a first edge of the first notch disposed near the display area of the substrate is provided with a binding area.

In an embodiment of the present disclosure, the first notch divides the non-display area of the substrate away from the end of the display area into a first non-display area and a second non-display area.

In an embodiment of the present disclosure, the array substrate further includes a cell test pad and an Ag glue pad, the cell test pad and the Ag glue pad are both disposed on the first non-display area and/or the second non-display area, and the cell test pad and the Ag glue pad are staggered.

In an embodiment of the present disclosure, a length of the binding area along a first direction is less than or equal to a length of the first notch along the first direction, and the first direction is perpendicular to a direction in which the non-display area points to the display area.

In an embodiment of the present disclosure, the array substrate further includes a plurality of input pads arranged along the first direction and equally spaced apart from the binding area, a ratio of a length of each of the input pads along the first direction to a length of each of the input pads along a second direction ranges between ⅓ and 100, and the second direction is a direction in which the non-display area points to the display area.

In an embodiment of the present disclosure, a length of the first non-display area along a first direction is same as a length of the second non-display area along the first direction, and the first direction is perpendicular to a direction in which the non-display area points to the display area.

In an embodiment of the present disclosure, the array substrate further includes a chip on film bound to the binding area and passing through the first notch to be bent to a side of the substrate facing away from the display area.

An embodiment of the present disclosure provides a display panel. The display panel includes an array substrate. The array substrate includes a substrate. The substrate includes a display area and a non-display area adjacent to the display area. The non-display area of the substrate away from an end of the display area has a first notch, and a first edge of the first notch disposed near the display area of the substrate is provided with a binding area.

In an embodiment of the present disclosure, the first notch divides the non-display area of the substrate away from the end of the display area into a first non-display area and a second non-display area.

In an embodiment of the present disclosure, the array substrate further includes a cell test pad and an Ag glue pad, the cell test pad and the Ag glue pad are both disposed on the first non-display area and/or the second non-display area, and the cell test pad and the Ag glue pad are staggered.

In an embodiment of the present disclosure, a length of the binding area along a first direction is less than or equal to a length of the first notch along the first direction, and the first direction is perpendicular to a direction in which the non-display area points to the display area.

In an embodiment of the present disclosure, the array substrate further includes a plurality of input pads arranged along the first direction and equally spaced apart from the binding area, a ratio of a length of each of the input pads along the first direction to a length of each of the input pads along a second direction ranges between ⅓ and 100, and the second direction is a direction in which the non-display area points to the display area.

In an embodiment of the present disclosure, a length of the first non-display area along a first direction is same as a length of the second non-display area along the first direction, and the first direction is perpendicular to a direction in which the non-display area points to the display area.

In an embodiment of the present disclosure, the array substrate further includes a chip on film bound to the binding area and passing through the first notch to be bent to a side of the substrate facing away from the display area.

An embodiment of the present disclosure provides a display device. The display device includes the above display panel and a backlight module. The backlight module includes a second notch corresponding to a position of the first notch of the display panel.

In an embodiment of the present disclosure, a vertical projection of the display panel on the backlight module is positioned in the backlight module.

In an embodiment of the present disclosure, the display panel further includes a chip on film configured to sequentially pass through the first notch and the second notch to be bent to a side of the backlight module facing away from the display panel.

In an embodiment of the present disclosure, a bending apex of the chip on film is positioned within the second notch.

In an embodiment of the present disclosure, a ratio of a vertical distance from the bending apex of the chip on film to the first edge along a second direction to a length of the first notch along the second direction ranges between 0.8 and 1.2, and the second direction is a direction in which the non-display area points to the display area.

The embodiment of the present disclosure provides an array substrate, a display panel, and a display device. A non-display area of the array substrate away from an end of a display area has a first notch, and a first edge of the first notch disposed near the display area is provided with a binding area to reduce a vertical distance between a binding area and the display area and this further reduces a border of the array substrate, such that the display device and the display panel including the array substrate have a narrow border and a high screen ratio.

DETAILED DESCRIPTION OF PREFERRED EMBODIMENTS

Reference characters of drawing are as follows. Substrate 10, display area 102, non-display area 101, first notch 101a, first edge 1021, binding area 101b, first non-display area 101c, second non-display area 101d, Ag glue pad 101e, cell test pad 1011, identification mark 1012, first trace 1013, second trace 1014, chip on film, input pad 1016, array substrate 11, color filter substrate 20, display panel 100, backlight module 200, second notch 102a, and second edge 2001.

The technical solutions in the embodiments of the present disclosure will be clearly and completely described in the following with reference to the accompanying drawings in the embodiments. It is apparent that the described embodiments are only a part of the embodiments of the present disclosure, and not all of them. All other embodiments obtained by those skilled in the art based on the embodiments of the present disclosure without creative efforts are within the scope of the present disclosure.

Figure 1:
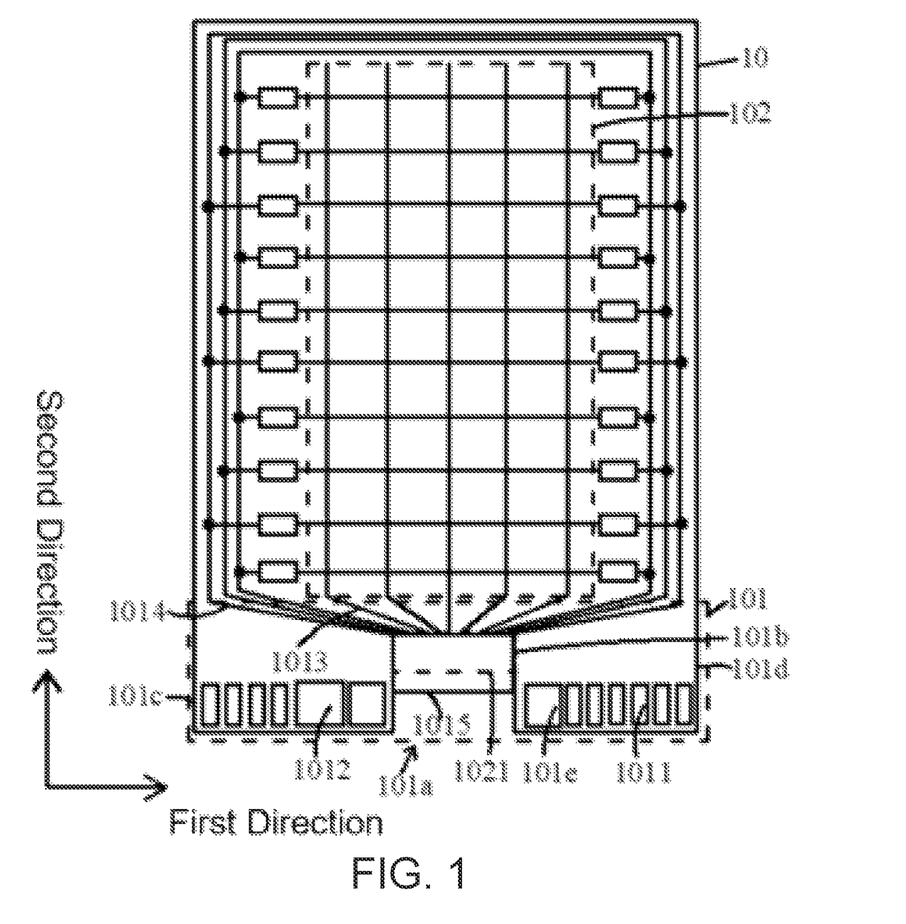
FIG. 1 is a first schematic structural view of an array substrate according to an embodiment of the present disclosure.

Referring to FIG. 1, a first schematic structural view of an array substrate according to an embodiment of the present disclosure is provided. The array substrate includes a substrate 10 having a display area 102 and a non-display area 101.

Vertically intersecting scan lines and data lines are disposed in the display area 102, and thin film transistors are disposed in an area where two adjacent scan lines and two adjacent data lines are enclosed. The scan lines are connected to gates of thin film transistors (not shown) to input scan signals, and the data lines are connected to sources of the thin film transistors to input data signals.

The non-display area 101 of the substrate 10 away from an end of the display area 102 has a first notch 101a. A first edge 1021 of the first notch 101a disposed near the display area 102 of the substrate 10 is provided with a binding area 101b. By arranging the binding area 101b to the first edge 1021 such that a vertical distance of the display area 102 to the binding area 101b is reduced to reduce a border of the array substrate, and the non-display area 101 is made to increase space of a circuit device other than traces along a second direction (a direction in which the non-display area 101 points to the display area 102).

A shape of the first notch 101a is a rectangle. The first notch 101a divides the non-display area 101 of the substrate 10 away from the end of the display area 102 into a first non-display area 101c and a second non-display area 101d. The first non-display area 101c and the second non-display area 101d are respectively positioned on both sides of the first notch 101a. Lengths of the first non-display area 101c and the second non-display area 101d are the same along a first direction, such that traces extending from the display area 102 near one end of the non-display area 101 to the binding area 101b can be uniformly wired, and the display panel made of the array substrate has a symmetrical appearance.

The array substrate further includes a cell test pad 1011 and an Ag glue pad 101e. After the cell test pad 1011 is further prepared into the display panel by the array substrate, a performance test is performed on the display panel by inputting a test signal to the cell test pad 1011. The Ag glue pad 101e is configured to coat a conductive silver paste, and the conductive silver paste is configured to connect a ground line (not shown) in the non-display area 101 of the array substrate and a conductive layer of a color filter substrate in the display panel opposite to the array substrate to prevent an electro-static discharge (ESD). The array substrate further includes an identification mark 1012 disposed in the first non-display area 101c or the second non-display area 101d, and the identification mark 1012 is configured to record related information of the array substrate. The cell test pad 1011, the Ag glue pad 101e, and the identification mark 1012 are disposed in the same row in the first non-display area 101c and the second non-display area 101d.

The array substrate further includes a plurality of traces extending from the display area 102 near one end of the non-display area 101 to the binding area 101b. The traces include a plurality of first traces 1013 connected to the data lines and a plurality of second traces 1014 connected to peripheral traces. The second traces 1014 are positioned on opposite sides of the first traces 1013.

The array substrate further includes a chip on film 1015 including a flexible substrate and a control chip (not shown) disposed on the flexible substrate. The control chip outputs a signal to the second traces 1014 to cause a gate driving circuit (gate on array, GOA) to output a scan signal to the scan lines, and the control chip outputs a signal to the first trace 1013 to cause the data lines to input a data signal. The chip on film 1015 is bound to the binding area 101b and passes through the first notch 101a to be bent to a side of the substrate 10 facing away from the display area 102. The first notch 101a provides a receiving space for a bent portion of the chip on film 1015 to further narrow a lower frame of the array substrate.

Figure 2:
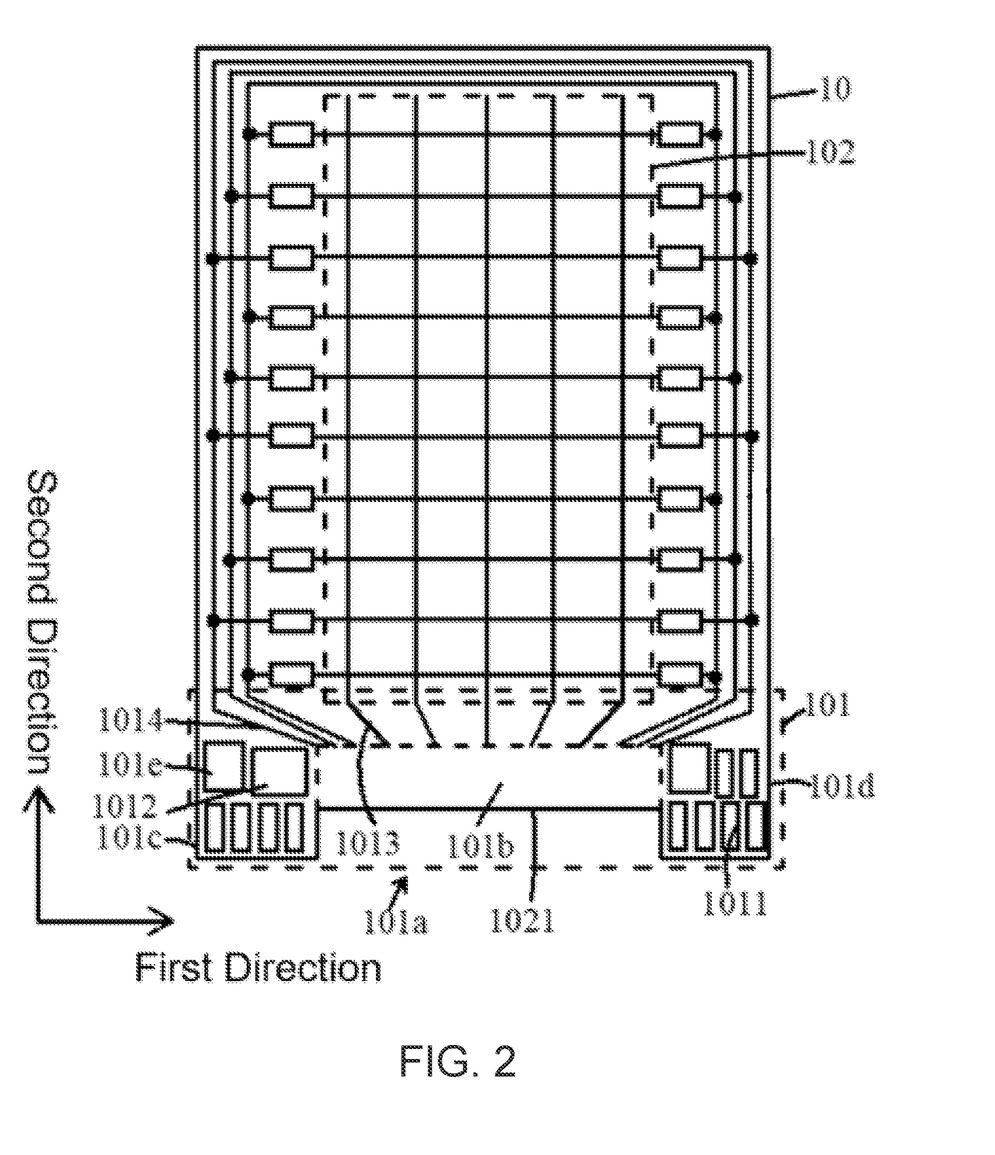
FIG. 2 is a second schematic structural view of an array substrate according to an embodiment of the present disclosure.

Referring to FIG. 2, a second schematic structural view of an array substrate according to an embodiment of the present disclosure is provided. The second schematic structural view is different from the first schematic structural view in that the cell test pad 1011 and the Ag glue pad 101e can be disposed in the first non-display area 101c and/or the second non-display area 101d, and the cell test pad 1011 and the Ag glue pad 101e are staggered, such that space occupied by the first non-display area 101c and the second non-display area bold along the first direction is reduced, such that a length of the first notch 101a along the first direction is increased. The first direction is perpendicular to a direction in which the non-display area 101 points to the display area 102.

The array substrate further includes an identification mark and a short-circuit ring (not shown). The identification mark 1012 and the short-circuit ring are both disposed in the non-display area 101. The identification mark 1012, the short-circuit ring, the Ag glue pad 101e, and the cell test pad 1011 are staggered along the first direction. In other structural diagrams of the array substrate, the cell test pad 1011 and the Ag glue pad 101e may also be positioned in the first non-display area 101c and the second non-display area 101d, respectively. A number of cell test pads 1011 is plural, and a plurality of cell test pads 1011 are staggered in the first non-display area 101c.

A length of the binding area 101b along the first direction is less than or equal to a length of the first notch 101a along the first direction. In details, the length of the binding area 101b along the first direction is equal to the length of the first notch 101a along the first direction, such that an input pad provided in the binding area 101b has the largest space available along the first direction.

Spacing between adjacent two traces along the first direction is greater than 1.5 microns. An angle between a first trace and the first direction is greater than an angle between a second trace and the first direction.

Figure 3:
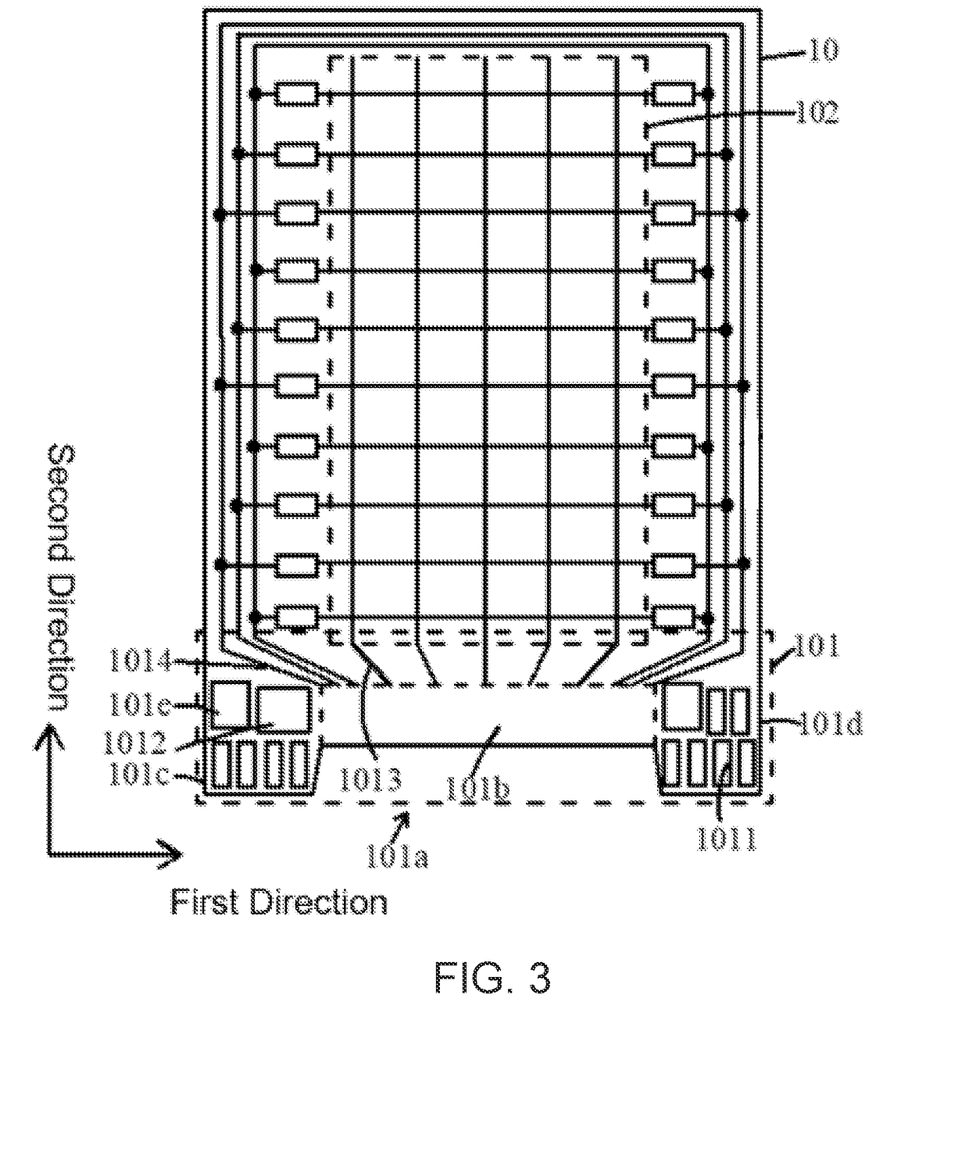
FIG. 3 is a third schematic structural view of an array substrate according to an embodiment of the present disclosure.

Referring to FIG. 3, a third schematic structural view of an array substrate according to an embodiment of the present disclosure is provided. The array substrate illustrated in FIG. 3 is different from the array substrate illustrated in FIG. 2 in that the first notch 101a is trapezoidal. Along the second direction, the first notch 101a has a trapezoidal shape with a narrow upper portion and a wide lower portion, such that space of the first notch 101a is larger, which is more advantageous for a display device in which the array substrate is manufactured as a narrow border.

Figure 4:
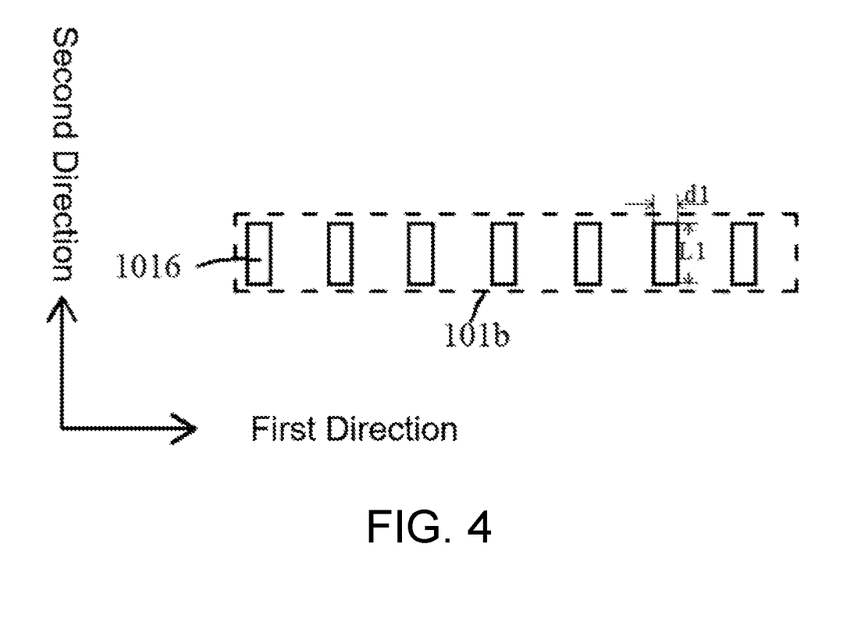
FIG. 4 is a first schematic structural view of a configuration of input pads in a binding area of FIG. 2.

Referring to FIG. 4, a first schematic structural view of a configuration of input pads 1016 in the binding area 101b of FIG. 2 is provided. Each of the input pads 1016 is strip-shaped and same. A ratio of a length d1 of each of the input pads 1016 along the first direction to a length L1 of each of the input pads 1016 along the second direction ranges between 1/20 and 1/5. The length d1 of each of the input pads 1016 along the first direction ranges between 5 micrometers and 100 micrometers, and the length L1 of each of the input pads 1016 along the second direction ranges between 100 micrometers and 500 micrometers. Each of the input pads 1016 has an area of not less than 500 square microns. Spacing of adjacent two input pads 1016 along the first direction is greater than 5 microns.

Because a length of the binding area 101b in FIG. 2 along the first direction is increased relative to a length of the binding area 101b in FIG. 1 along the first direction, spacing of adjacent two traces along the first direction in FIG. 2 is increased relative to spacing of adjacent two traces in FIG. 1 along the first direction to avoid a contact between the adjacent two traces, such that space occupied by the traces along the second direction is reduced. That is, a distance from the binding area 1011 to the display area 102 is further reduced, and a lower frame of the array substrate is further narrowed. The length of the binding area 101b in FIG. 2 relative to the binding area 101b in FIG. 1 increases along a first direction, such that space available for each of the input pads 1016 along the first direction increases. By increasing the length of each of the input pads 1016 along the first direction to increase an area of each of the input pads, an area in which the chip on film 1015 contacts the input pads 1016 can be made larger to improve a binding yield.

Figure 5:
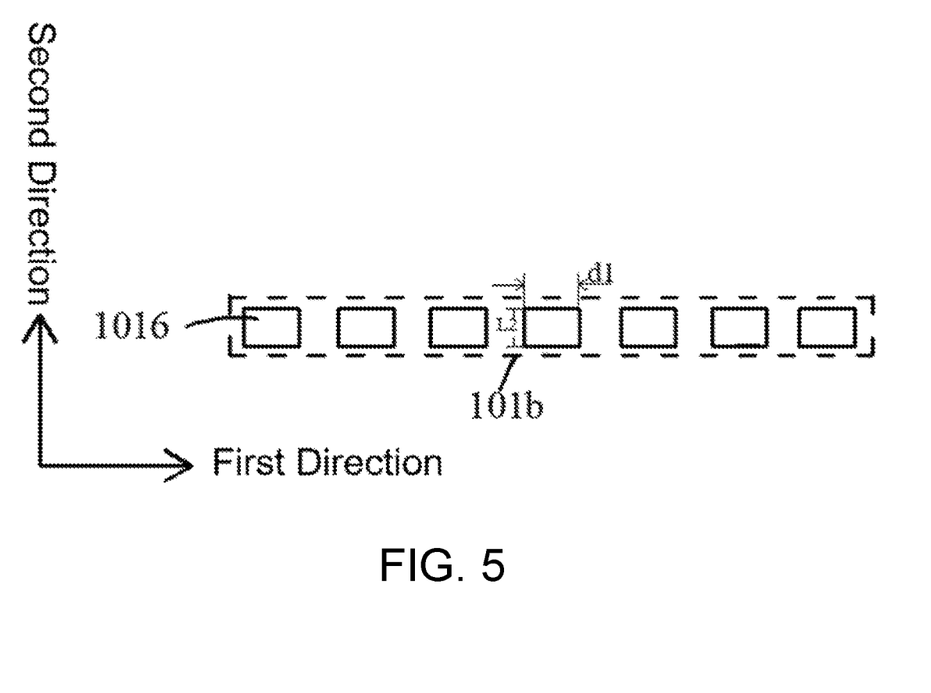
FIG. 5 is a second schematic structural view of a configuration of input pads in a binding area of FIG. 2.

Referring to FIG. 5, a second schematic structural view of a configuration of input pads 1016 in the binding area 101b of FIG. 2 is provided. The input pads illustrated in FIG. 5 differs from the input pads illustrated in FIG. 4 in that each of the input pads 1016 has a flat shape. In details, a ratio of a length d1 of each of the input pads 1016 along the first direction to a length L2 of each of the input pads 1016 along the second direction ranges between 1/3 and 100. Further, a ratio of the length d1 of each of the input pads 1016 along the first direction to the length L2 of each of the input pads 1016 along the second direction ranges between 1/3 and 20. Each of the input pads 1016 has an area of not less than 500 square microns. With respect to the input pads 1016 in FIG. 4, the length of each of the input pads 1016 in FIG. 5 increases along the first direction and decreases along the second direction. The length of each of the input pads 1016 along the second direction is reduced such that space occupied by the binding area 101b along the second direction is reduced.

An embodiment of the present disclosure also provides a display panel, which may be a liquid crystal display panel or an organic light emitting diode display panel. The display panel includes the above array substrate.

Figure 6:
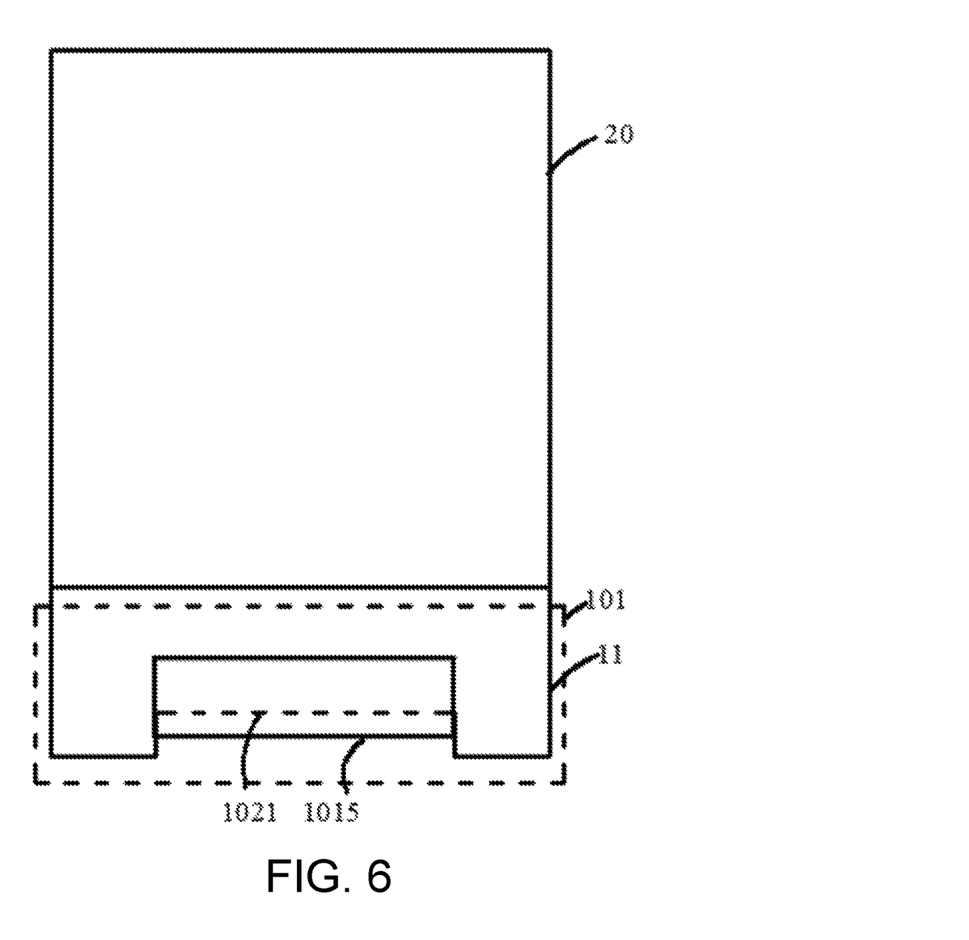
FIG. 6 is a first schematic structural view of a display panel according to an embodiment of the present disclosure.

Referring to FIG. 6, a first schematic structural view of a display panel according to an embodiment of the present disclosure is provided. The display panel includes an array substrate 11 and a color filter substrate 20. The array substrate 11 and the color filter substrate 20 are connected by a sealant, and a stepped area is formed between the array substrate 11 and the color filter substrate 20. The step area is the non-display area 101 of the array substrate. One end of the stepped area away from the color filter substrate 20 has a first notch. The first notch is adjacent to a first edge 1021 of the color filter substrate 20 and is provided with a binding area. A chip on film 1015 is bound to the binding area on the array substrate 11. The chip on film 1015 passes through the first notch of the array substrate 10 to be bent to a side of the array substrate 11 facing away from the color filter substrate 20.

The display panel of the embodiment of the present disclosure arranges a first notch by one end of the non-display area of the array substrate away from the display area, and the first notch is disposed near the first edge of the display area of the array substrate to reduce the vertical distance from the binding area to the display area. Thereby, the lower frame of the display panel is reduced, and the stepped area of the display panel is increased in a direction in which the stepped area points to the display area for arranging circuit devices other than traces.

Figure 7:
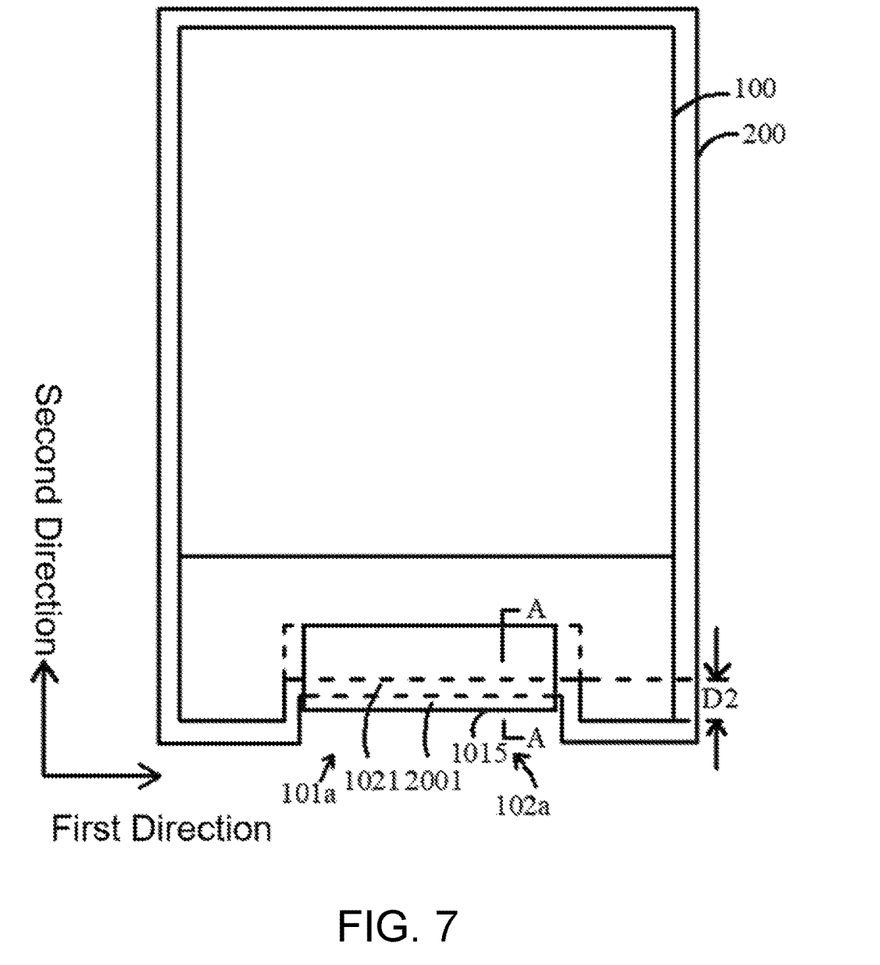
FIG. 7 is a first schematic structural view of a display device according to an embodiment of the present disclosure.

Referring to FIG. 7, a first schematic structural view of a display device according to an embodiment of the present disclosure is provided. The display device includes a display panel 100 and a backlight module 200.

The display panel 100 includes the above array substrate and the above color filter substrate. A stepped area formed by the array substrate and the color filter substrate is provided with a first notch 101a. The first notch 101a is rectangular, and the first notch 101a is positioned at an end of the stepped area away from the color filter substrate. The stepped area is the non-display area 101 in the above array substrate. A first edge 1021 of the first notch 101a disposed near the display area of the array substrate is provided with a binding area.

The backlight module 200 provides a light source for a display panel 100, and the backlight module 200 is positioned on a back surface of a light emitting surface of the display panel 100. The backlight module 200 has a second notch 102a corresponding to a position of a first notch 101a of the display panel 100. The second notch 102a has the same shape as the first notch 101a, that is, the second notch 102a has a rectangular shape. In other structural diagrams of the display device, the shape of the second notch 102a may be different from the first notch 101a. A vertical projection of the display panel 100 on the backlight module 200 is positioned in the backlight module 200 to enable the backlight module 200 to protect the display panel 100.

The display panel 100 further includes a chip on film 1015, and the chip on film 1015 is bound to the binding area.

Figure 8:
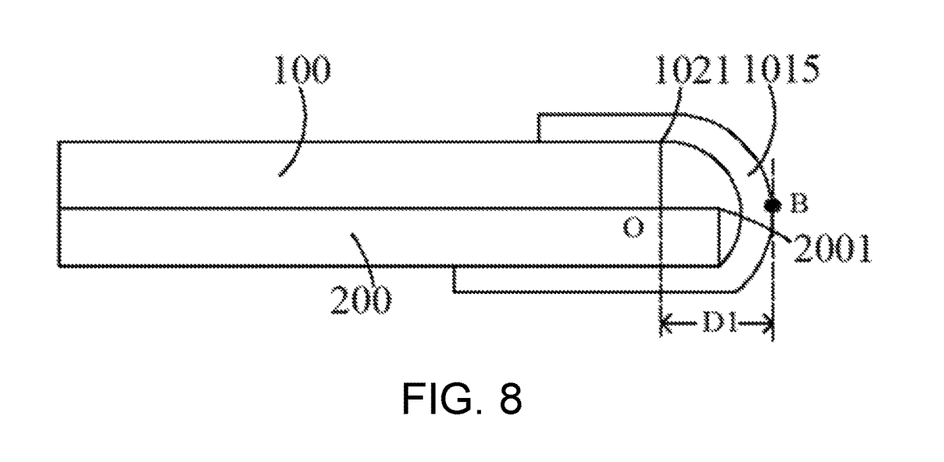
FIG. 8 is a cross-sectional view taken along line A-A of the display device illustrated in FIG. 7.
Figure 9:
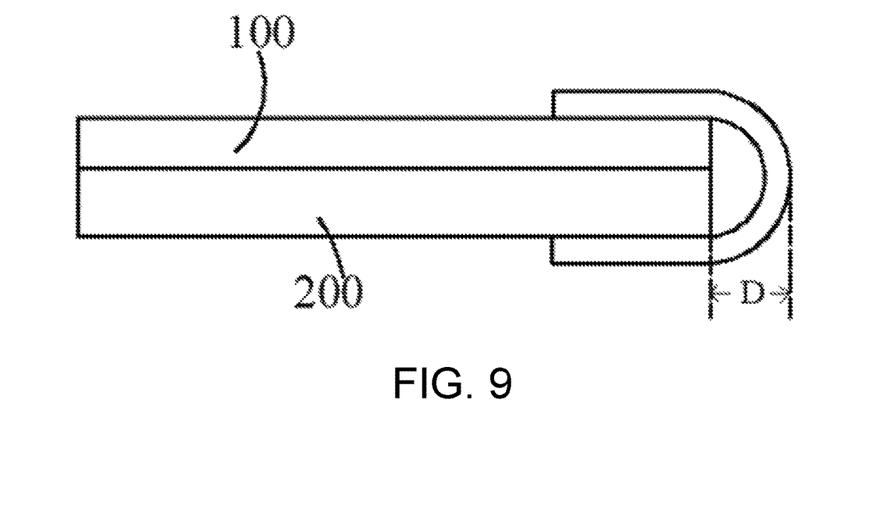
FIG. 9 is a schematic structural view of a conventional chip on film bent from a side of a display panel to a back surface of a backlight module.

Referring to FIG. 8, a cross-sectional view taken along line A-A of the display device illustrated in FIG. 7 is provided. The chip on film 1015 sequentially passes through the first notch 101a and the second notch 102a to be bent to a side of the backlight module 200 facing away from the display panel 100. As illustrated in FIG. 9, a schematic structural view of a conventional chip on film bent from a side of a display panel 100 to a back surface of a backlight module 200 is provided. When the chip on film is bent, a lower frame of the display device is increased by a distance D. In the embodiment of the present discourse, the chip on film 1015 is positioned in the first notch 101a and the second notch 102a or partially outside the second notch 102a due to space occupied by bending along the second direction, such that a size of the lower frame of the display device of the embodiment of the present disclosure is reduced relative to a lower frame of the display device in the prior art.

Further, a bending apex B of the chip on film 1015 is positioned in the second notch 102a to further reduce an overall size of the display device, thereby achieving a narrow border and a high screen ratio. The bending apex B of the chip on film 1015 is a point at which a vertical distance from the second edge 2001 is the largest on a bending section of the chip on film along the second direction, and the second edge 2001 is an edge of the second notch 102a adjacent to the display area of the display panel 100. The display area of the display panel 100 is the display area of the above array substrate.

Further, a ratio of a vertical distance D1 from the bending apex B of the chip on film 1015 to the first edge 1021 along the second direction to a length D2 of the first notch 101a along the second direction ranges between 0.8 and 1.2, and the first edge 1021 is an edge of the first notch 101a that is adjacent to the display area of the display panel 100.

Figure 10:
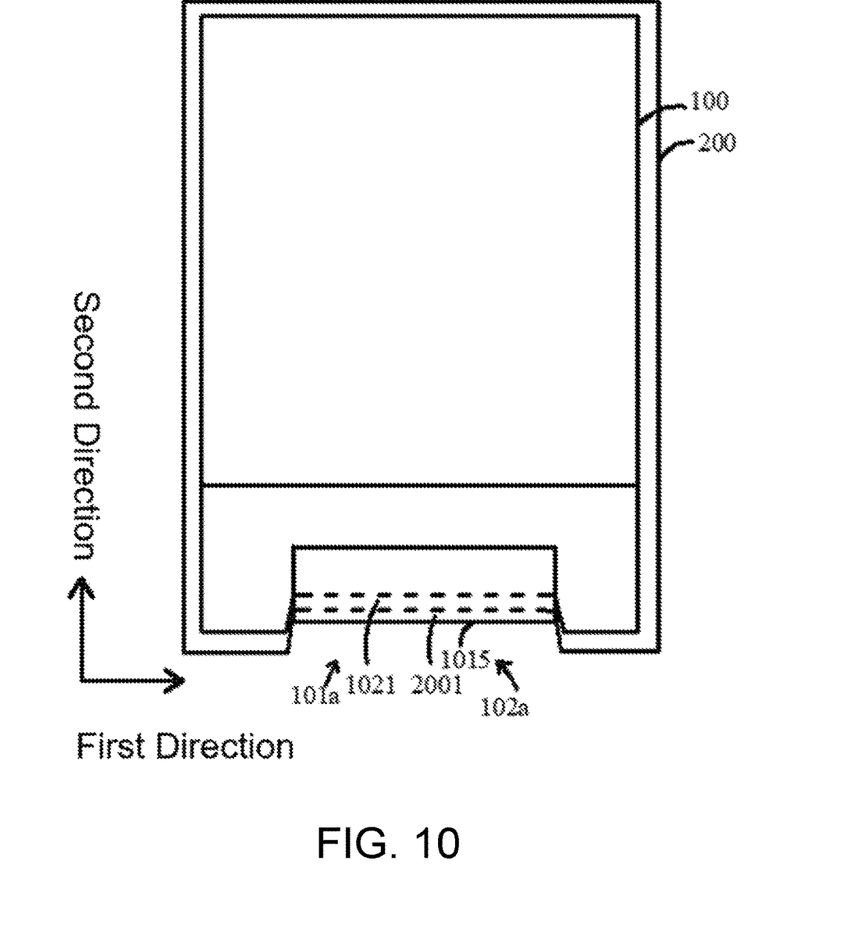
FIG. 10 is a second schematic structural view of a display device according to an embodiment of the present disclosure.

Referring to FIG. 10, a second schematic structural view of a display device according to an embodiment of the present disclosure is provided. The display device illustrated in FIG. 10 is different from the display device illustrated in FIG. 8 in that the first notch 101a and the second notch 102a are trapezoidal. The first notch 101a and the second notch 102a are trapezoidal, such that a size of the backlight module 200 is greater than a size of the display panel 100, and when the display panel 100 is protected, an contact area of the chip on film 1015 and the binding area of the display panel 100 is larger.

The display device of the embodiment of the present disclosures arranges the first notch on one end of the non-display area of the array substrate away from the display area, and the first notch is disposed adjacent to the first edge of the display area of the array substrate to reduce the vertical distance of the binding area to the display area. The second notch is disposed at a position corresponding to the first notch of the array substrate of the backlight module, so as to reduce the frame of the display device and increase the screen ratio, such that the flip on film bound to the binding area sequentially passes through the first notch and the second notch to further reduce the frame of the display device and increase the screen ratio.

The description of the above embodiments is only for helping to understand the technical solutions of the present disclosure and the core ideas thereof. It is understood by those skilled in the art that the technical solutions described in the foregoing embodiments may be modified, or some of the technical features may be equivalently replaced. The modifications and substitutions do not depart from the scope of the technical solutions of the embodiments of the present disclosure.

What is claimed is:

1. An array substrate, comprising:
   a substrate comprising a display area and a non-display area adjacent to the display area, wherein the non-display area of the substrate away from an end of the display area has a first notch, and a first edge of the first notch disposed near the display area of the substrate is provided with a binding area; and
   a chip on film bound to the binding area and passing through the first notch to be bent to a side of the substrate facing away from the display area;
   wherein the first notch divides the non-display area of the substrate away from the end of the display area into a first non-display area and a second non-display area; and
   wherein a length of the first non-display area along a first direction is same as a length of the second non-display area along the first direction.

2. The array substrate according to claim 1, further comprising a cell test pad and an Ag glue pad, wherein the cell test pad and the Ag glue pad are both disposed on the first non-display area and/or the second non-display area, and the cell test pad and the Ag glue pad are staggered.

3. The array substrate according to claim 2, wherein a length of the binding area along a first direction is less than or equal to a length of the first notch along the first direction, and the first direction is perpendicular to a direction in which the non-display area points to the display area.

4. The array substrate according to claim 3, further comprising a plurality of input pads arranged along the first direction and equally spaced apart from the binding area, wherein a ratio of a length of each of the input pads along the first direction to a length of each of the input pads along a second direction ranges between 1/3 and 100, and the second direction is a direction in which the non-display area points to the display area.

5. The array substrate according to claim 1, wherein the first direction is perpendicular to a direction in which the non-display area points to the display area.

6. A display panel, comprising:
an array substrate comprising a substrate, wherein the substrate comprises a display area and a non-display area adjacent to the display area, the non-display area of the substrate away from an end of the display area has a first notch, and a first edge of the first notch disposed near the display area of the substrate is provided with a binding area;
wherein the first notch divides the non-display area of the substrate away from the end of the display area into a first non-display area and a second non-display area; and
wherein a length of the first non-display area along a first direction is same as a length of the second non-display area along the first direction, and the first direction is perpendicular to a direction in which the non-display area points to the display area.

7. The display panel according to claim 6, wherein the array substrate further comprises a cell test pad and an Ag glue pad, the cell test pad and the Ag glue pad are both disposed on the first non-display area and/or the second non-display area, and the cell test pad and the Ag glue pad are staggered.

8. The display panel according to claim 7, wherein a length of the binding area along a first direction is less than or equal to a length of the first notch along the first direction, and the first direction is perpendicular to a direction in which the non-display area points to the display area.

9. The display panel according to claim 8, wherein the array substrate further comprises a plurality of input pads arranged along the first direction and equally spaced apart from the binding area, a ratio of a length of each of the input pads along the first direction to a length of each of the input pads along a second direction ranges between $1/3$ and 100, and the second direction is a direction in which the non-display area points to the display area.

10. The display panel according to claim 6, wherein the array substrate further comprises a chip on film bound to the binding area and passing through the first notch to be bent to a side of the substrate facing away from the display area.

11. A display device, comprising:
the display panel according to claim 6; and
a backlight module comprising a second notch corresponding to a position of the first notch of the display panel.

12. The display device according to claim 11, wherein a vertical projection of the display panel on the backlight module is positioned in the backlight module.

13. The display device according to claim 11, wherein the display panel further comprises a chip on film configured to sequentially pass through the first notch and the second notch to be bent to a side of the backlight module facing away from the display panel.

14. The display device according to claim 13, wherein a bending apex of the chip on film is positioned within the second notch.

15. The display device according to claim 14, wherein a ratio of a vertical distance from the bending apex of the chip on film to the first edge along a second direction to a length of the first notch along the second direction ranges between 0.8 and 1.2, and the second direction is a direction in which the non-display area points to the display area.

* * * * *